United States Patent
Bemrich et al.

(10) Patent No.: US 9,434,261 B2
(45) Date of Patent: Sep. 6, 2016

(54) WELDED CONTACTOR CHECKING SYSTEMS AND METHODS

(71) Applicants: Robert Bosch GmbH, Stuttgart (DE); Samsung SDI Co., Ltd., Yongin-si, Gyeonggi-do (KR)

(72) Inventors: Jacob R. Bemrich, Rochester Hills, MI (US); Joshua M. Anzicek, Clarkston, MI (US)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 554 days.

(21) Appl. No.: 13/647,890

(22) Filed: Oct. 9, 2012

(65) Prior Publication Data

US 2013/0093427 A1    Apr. 18, 2013

Related U.S. Application Data

(60) Provisional application No. 61/547,948, filed on Oct. 17, 2011.

(51) Int. Cl.
    *B60L 11/12*    (2006.01)
    *G01R 31/327*    (2006.01)
    (Continued)

(52) U.S. Cl.
    CPC ............ *B60L 11/123* (2013.01); *B60L 3/0046* (2013.01); *B60L 3/0069* (2013.01); *B60L 3/04* (2013.01); *B60L 3/12* (2013.01); *B60L 11/1803* (2013.01); *B60L 11/1816* (2013.01);
    (Continued)

(58) Field of Classification Search
None
See application file for complete search history.

(56) References Cited

U.S. PATENT DOCUMENTS 5,831,804 A * 11/1998 Vilou .............................. 361/28
6,828,798 B2 * 12/2004 Morimoto ..................... 324/527
(Continued)

FOREIGN PATENT DOCUMENTS

DE    10 2009 035 483 A1    2/2011
DE    10 2010 027 856 A1    10/2011
(Continued)

OTHER PUBLICATIONS

International Search Report and Written Opinion in corresponding PCT application (i.e., PCT/US2012/062573), mailed Aug. 27, 2013 (10 pages).

(Continued)

*Primary Examiner* — Melissa Koval
*Assistant Examiner* — Felicia Farrow
(74) *Attorney, Agent, or Firm* — Maginot Moore & Beck LLP

(57) ABSTRACT

A system includes a plurality of batteries, first and second relays, a relay control module, and a welding indication module. The batteries are electrically connected and collectively output power for an electric motor via first and second nodes. The first relay is connected between a first output of the batteries and the first node. The second relay is connected between a second output of the batteries and the second node. The relay control module controls the first and second relays. The welding indication module commands the relay control module to open the first relay during a diagnosis period, commands the relay control module to close the second relay during the diagnosis period, and indicates whether the first relay is welded closed based on a voltage between the first and second nodes during the diagnosis period.

16 Claims, 8 Drawing Sheets

(51) Int. Cl.
*B60L 3/00* (2006.01)
*B60L 3/12* (2006.01)
*B60L 11/18* (2006.01)
*H01H 47/00* (2006.01)
*B60L 3/04* (2006.01)

(52) U.S. Cl.
CPC ....... *B60L 11/1861* (2013.01); *B60L 11/1864* (2013.01); *B60L 11/1874* (2013.01); *B60L 11/1875* (2013.01); *G01R 31/3278* (2013.01); *H01H 47/002* (2013.01); *B60L 2220/42* (2013.01); *B60L 2240/545* (2013.01); *B60L 2240/547* (2013.01); *B60L 2240/549* (2013.01); *B60L 2240/80* (2013.01); *B60L 2250/10* (2013.01); *B60L 2250/16* (2013.01); *B60L 2270/20* (2013.01); *Y02T 10/6217* (2013.01); *Y02T 10/648* (2013.01); *Y02T 10/7005* (2013.01); *Y02T 10/7022* (2013.01); *Y02T 10/7044* (2013.01); *Y02T 10/7061* (2013.01); *Y02T 10/7072* (2013.01); *Y02T 10/7077* (2013.01); *Y02T 90/14* (2013.01)

(56) References Cited

U.S. PATENT DOCUMENTS

| | | |
|---|---|---|
| 6,882,129 B2 | 4/2005 | Boskovitch et al. |
| 7,242,196 B2 | 7/2007 | Yudahira et al. |
| 7,368,829 B2 | 5/2008 | Tezuka |
| 7,404,459 B2 | 7/2008 | Nakanishi et al. |
| 7,557,583 B2 * | 7/2009 | Zettel et al. ................ 324/418 |
| 7,573,150 B2 | 8/2009 | Hirasawa |
| 7,586,214 B2 | 9/2009 | Clarke et al. |
| 7,608,940 B2 * | 10/2009 | Osawa ............... H02J 7/0029 307/10.7 |
| 7,964,985 B2 | 6/2011 | Ozaki et al. |
| 2002/0070608 A1 * | 6/2002 | Matsuki et al. ................ 307/9.1 |
| 2003/0075980 A1 * | 4/2003 | Yoshida et al. ................ 307/9.1 |
| 2004/0061503 A1 * | 4/2004 | Morimoto ..................... 324/418 |
| 2005/0253460 A1 | 11/2005 | Nakanishi et al. |
| 2006/0071618 A1 * | 4/2006 | Yudahira ............... B60L 3/0023 318/12 |
| 2007/0205771 A1 * | 9/2007 | Drake et al. .................. 324/418 |
| 2007/0221627 A1 | 9/2007 | Yugou et al. |
| 2007/0247106 A1 | 10/2007 | Kawahara et al. |
| 2008/0217095 A1 * | 9/2008 | Ono .............................. 180/443 |
| 2009/0160247 A1 * | 6/2009 | Nakamura et al. ........... 307/9.1 |
| 2009/0160249 A1 * | 6/2009 | Soma et al. .................. 307/9.1 |
| 2010/0001582 A1 | 1/2010 | Hewhouse et al. |
| 2010/0038962 A1 * | 2/2010 | Komatsu ..................... 307/10.1 |
| 2010/0127565 A1 | 5/2010 | Fukazu et al. |
| 2010/0181827 A1 * | 7/2010 | Cunningham et al. ........ 307/9.1 |
| 2010/0244558 A1 * | 9/2010 | Mitsutani et al. ........... 307/9.1 |
| 2010/0271036 A1 * | 10/2010 | Kishimoto et al. ........... 324/434 |
| 2010/0296204 A1 | 11/2010 | Ichikawa et al. |
| 2011/0084704 A1 | 4/2011 | Myoen et al. |
| 2011/0244282 A1 * | 10/2011 | Seto et al. ...................... 429/82 |

FOREIGN PATENT DOCUMENTS

| | | |
|---|---|---|
| EP | 1 837 944 A2 | 9/2007 |
| EP | 2 068 417 A1 | 6/2009 |
| JP | 2004048937 | 2/2004 |
| JP | 2005116485 | 4/2005 |
| JP | 2008301612 | 12/2008 |
| JP | 2011083151 | 4/2011 |
| WO | 2006/121144 A1 | 11/2006 |

OTHER PUBLICATIONS

International Search Report and Written Opinion in corresponding PCT application (i.e., PCT/US2012/060360), mailed Jul. 12, 2013 (10 pages).

* cited by examiner

WELDED CONTACTOR CHECKING SYSTEMS AND METHODS

CROSS-REFERENCE TO RELATED APPLICATIONS

This application claims the benefit of U.S. Provisional Application No. 61/547,948, filed on Oct. 17, 2011. The disclosure of the above application is incorporated herein by reference in its entirety.

FIELD

The present disclosure relates to battery packs and more specifically to systems and methods for diagnosing welding of one or more electrical contactors.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Battery systems may be used to provide power in a wide variety of applications. Examples of transportable applications include hybrid electric vehicles (HEV), plug-in HEVs, electric vehicles (EV), heavy duty vehicles (HDV), and vehicles with 42-volt electrical systems. Examples of stationary applications include backup power for telecommunications systems, uninterruptible power supplies (UPS), and distributed power generation applications.

Examples of the types of batteries that are used include nickel metal hydride (NiMH) batteries, lead-acid batteries, lithium batteries, lithium-ion batteries, and other types of batteries. A battery pack or system may include a plurality of battery subpacks that are connected in series, parallel, or a combination thereof. The battery subpacks may include a plurality of batteries that are connected in series, parallel, or a combination thereof.

SUMMARY

In a feature, a system includes a plurality of batteries, first and second relays, a relay control module, and a welding indication module. The batteries are electrically connected and collectively output power for an electric motor via first and second nodes. The first relay is connected between a first output of the batteries and the first node. The second relay is connected between a second output of the batteries and the second node. The relay control module controls the first and second relays. The welding indication module commands the relay control module to open the first relay during a diagnosis period, commands the relay control module to close the second relay during the diagnosis period, and indicates whether the first relay is welded closed based on a voltage between the first and second nodes during the diagnosis period.

In other features, a method includes: providing a plurality of batteries that are electrically connected and that collectively output power for an electric motor via first and second nodes; providing a first relay that is connected between a first output of the batteries and the first node; and providing a second relay that is connected between a second output of the batteries and the second node. The method further includes: controlling the first and second relays; commanding opening of the first relay during a diagnosis period; commanding closing of the second relay during the diagnosis period; and indicating whether the first relay is welded closed based on a voltage between the first and second nodes during the diagnosis period.

In still other features, a system includes a plurality of batteries, first and second relays, a relay control module, and a welding indication module. The batteries are electrically connected and collectively output power for a load via first and second nodes. The first relay is connected between a first output of the batteries and the first node. The second relay is connected between a second output of the batteries and the second node. The relay control module controls the first and second relays. The welding indication module commands the relay control module to open the first relay during a diagnosis period, commands the relay control module to close the second relay during the diagnosis period, and indicates whether the first relay is welded closed based on a voltage between the first and second nodes during the diagnosis period.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

A battery pack includes a plurality of individual batteries connected in series, parallel, or a combination thereof. The batteries may be connected, for example, to enable the battery pack to provide one or more different outputs (e.g., voltage and/or current) than the batteries individually outputs.

A positive relay is connected between a positive reference potential of the batteries and a load, such as an inverter of an electric vehicle. The inverter provides power to one or more electric motors of the vehicle. A pre-charge relay is also connected between the positive reference potential and the load. A negative relay is connected between a negative reference potential of the batteries and the load. The negative relay and at least one of the positive relay and the pre-charge relay is closed to provide power to the load.

A battery control module controls the relays. Under some circumstances, the battery control module may open the relays, such as during vehicle shutdown, when one or more vehicle faults have been detected, and other circumstances. Opening the relays isolates the batteries from the load. Before all of the relays are opened, the battery control module according to the present disclosure determines and indicates whether one or more of the relays are welded closed.

Figure 1:
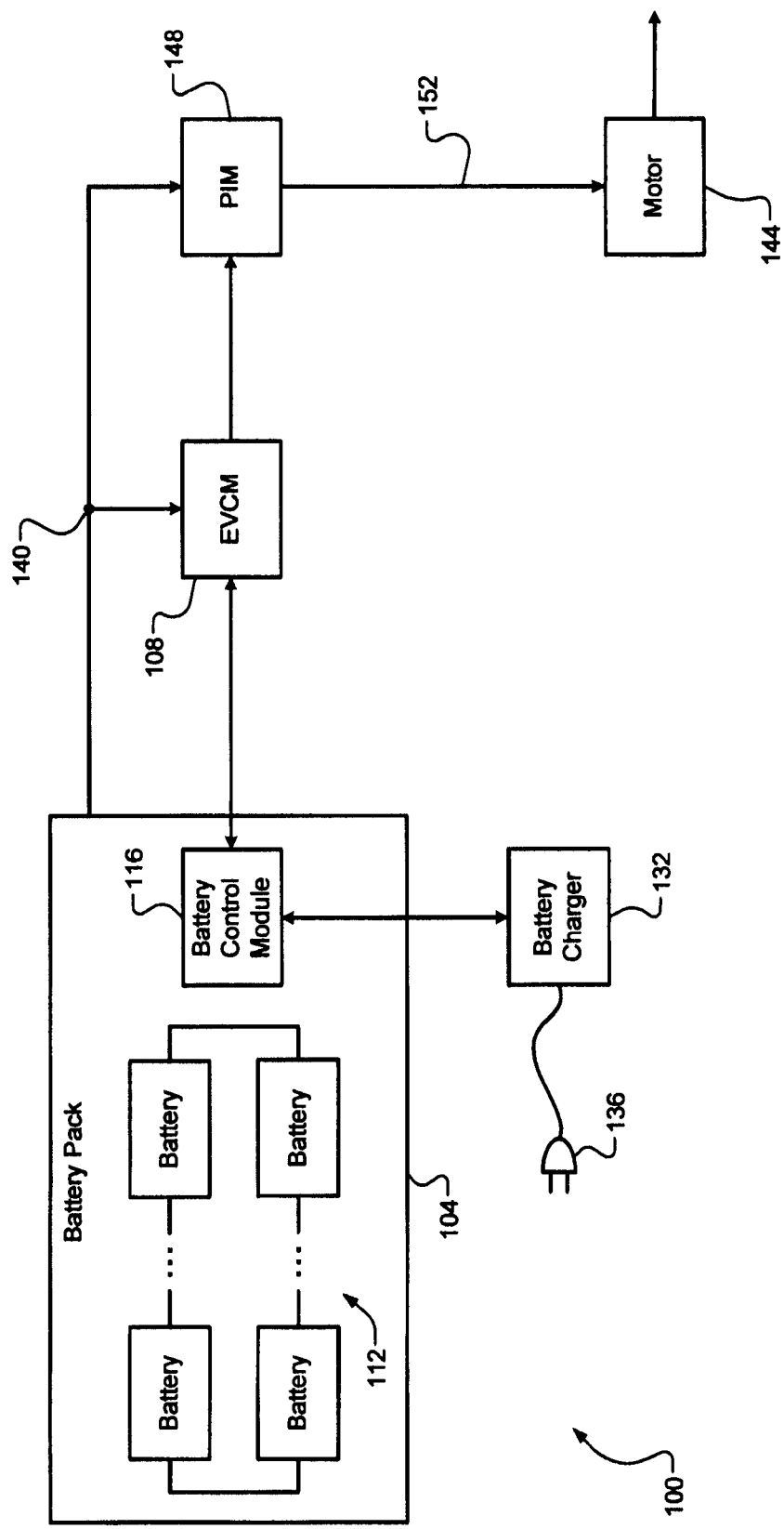
FIG. 1 is a functional block diagram of an example electric vehicle system including a battery pack according to the present disclosure.

Referring now to FIG. 1, an electric vehicle 100 includes a battery pack 104 and an electric vehicle control module (EVCM) 108. The battery pack 104 includes a plurality of individual batteries 112 and a battery control module 116. While only the battery pack 104 is shown, multiple battery packs may be included and connected in series, parallel, or a combination thereof.

The battery control module 116 controls various functions of the battery pack 104 and monitors and collects various characteristics of the battery pack 104. For example, the battery control module 116 monitors characteristics including, but not limited to, voltage, current, and/or one or more temperatures associated with the battery pack 104.

The battery control module 116 may determine one or more performance variables of the battery pack 104 based on the characteristics. For example only, the battery control module 116 may estimate a state of charge (SOC) of the battery pack 104 based on the voltage, current, and temperature of the battery pack 104. The battery control module 116 may additionally or alternatively determine one or more other performance variables based on the voltage, current, and/or temperature of the battery pack 104. The battery control module 116 may also control heating and cooling of the battery pack 104. The battery control module 116 may initiate heating and/or cooling of the battery pack 104 based on the temperature.

The battery control module 116 may communicate with a battery charger 132, such as a battery charger of an electric or hybrid vehicle. The battery charger 132 charges the battery pack 104 and may include a user interface (not shown) for providing visual indications of the condition of the battery pack 104, such as the SOC of the battery pack 104. The battery charger 132 includes a plug 136 that interfaces with a power source (not shown) to provide charging power to the battery pack 104 via the battery charger 132.

The EVCM 108 communicates with the battery pack 104 and the battery control module 116 to control various functions of the vehicle 100. For example, the EVCM 108 receives voltage 140 from the battery pack 104. The EVCM 108 receives information from the battery control module 116 related to, for example only, the monitored characteristics of the battery pack 104, one or more of the performance variables, and functions of the battery control module 116, and the battery charger 132.

The EVCM 108 controls a motor 144 of the vehicle 100 via a power inverter module (PIM) 148. The PIM 148 converts direct current (DC) voltage (e.g., the voltage 140) to alternating current (AC) voltage 152 and provides the AC voltage 152 to the motor 144. The motor 144 provides torque (e.g., to drive wheels) of the vehicle 100. Alternatively, the motor 144 may be implemented as a DC motor, and the PIM 148 may be replaced by a motor controller that provides a DC voltage to the motor 144.

Figure 2:
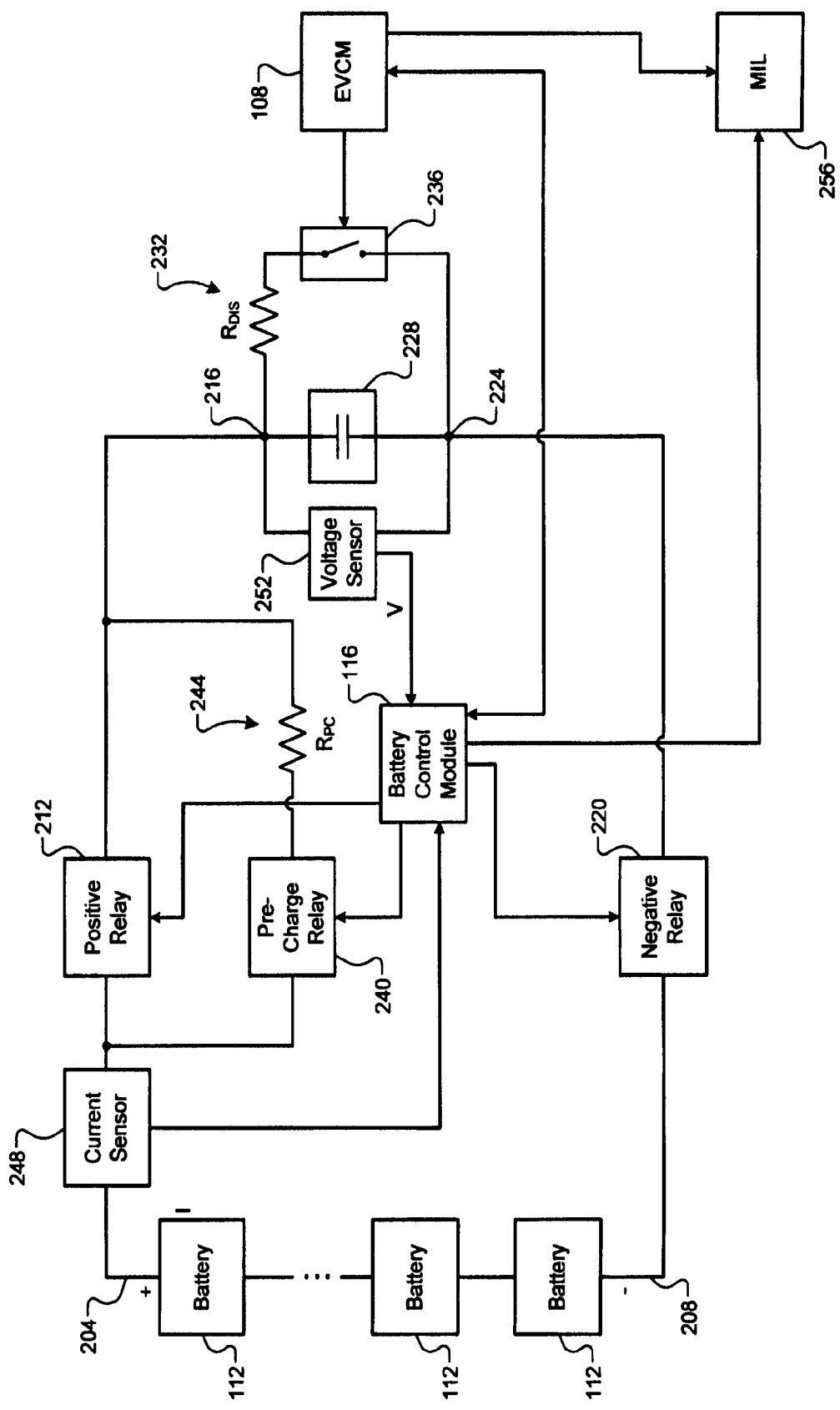
FIG. 2 is a functional block diagram of an example battery pack system according to the present disclosure.

Referring now to FIG. 2, a functional block diagram of an example battery pack system is presented. The batteries 112 are connected in series, parallel, or a combination thereof. The batteries 112 collectively output power via a first node 204 and a second node 208. A positive reference potential is present at the first node 204, and a negative reference potential is present at the second node 208. The voltage between the first node 204 and the second node 208 will be referred to as the battery voltage.

A positive relay 212 is connected between the first node 204 and a third node 216 (as depicted in FIG. 2, the positive relay 212 is connected to the first node 204 via a current sensor 248). A negative relay 220 is connected between the second node 208 and a fourth node 224. Vehicle electronic components, such as the PIM 148, are connected between the third node 216 and the fourth node 224 and are generally illustrated by vehicle capacitance 228.

A first end of a discharge resistor 232 may be connected to the third node 216, and a second end of the discharge resistor 232 may be connected to a first end of a discharge switch 236. A second end of the discharge switch 236 may be connected to the fourth node 224. The EVCM 108 may control the discharge switch 236. In various implementations, the discharge resistor 232 and the discharge switch 236 may be omitted and energy discharge may be performed in another suitable manner.

A first end of a pre-charge relay 240 is also connected the first node 204 (as depicted in FIG. 2, the pre-charge relay 240 is connected to the first node 204 via the current sensor 248). A pre-charge resistor 244 is connected between a second end of the pre-charge relay 240 and the third node 216.

The current sensor 248 measures current flow to the third node 216. For example only, the current sensor 248 may include a Hall-effect sensor, a resistor for sensing current, or another suitable type of current sensor. While the current sensor 248 is shown as measuring current on the positive leg, the current sensor 248 may measure current flow to the load in another suitable location. A voltage sensor 252 measures voltage between the third and fourth nodes 216 and 224. The voltage between the third and fourth nodes 216 and 224 will be referred to as the output voltage. The voltage sensor 252 or another voltage sensor measures voltage between the first and second nodes 204 and 208.

The battery control module 116 controls the positive relay 212, the negative relay 220, and the pre-charge relay 240. For example only, the battery control module 116 may open the positive relay 212, the negative relay 220, and the pre-charge relay 240 while the vehicle 100 is shutdown. To enable use of power from the batteries 112, such as to power the motor 144, the battery control module 116 may close the pre-charge relay 240, close the negative relay 220, and maintain the positive relay 212 open. Closing the pre-charge relay 240 may initially limit current flow to the vehicle electronics relative to closing the positive relay 212.

Once the voltage measured by the voltage sensor 252 reaches a predetermined value (e.g., a predetermined percentage of the battery voltage), the battery control module 116 may close the positive relay 212, maintain the negative relay 220 closed, and open the pre-charge relay 240. The battery control module 116 may maintain the positive and negative relays 212 and 220 closed until a request is received to open the positive and negative relays 212 and 220, such as during or after vehicle shutdown.

As discussed in more detail below, the battery control module 116 determines whether the positive relay 212 and/or the pre-charge relay 240 is welded closed. The battery control module 116 may also determine whether the negative relay 220 is welded closed. When one or more of the relays is welded closed, one or more remedial actions may be taken, such as setting a predetermined diagnostic trouble code (DTC) in memory, illuminating a malfunction indicator lamp (MIL) 256, limiting a speed of the vehicle 100, and/or one or more other suitable remedial actions.

Figure 3:
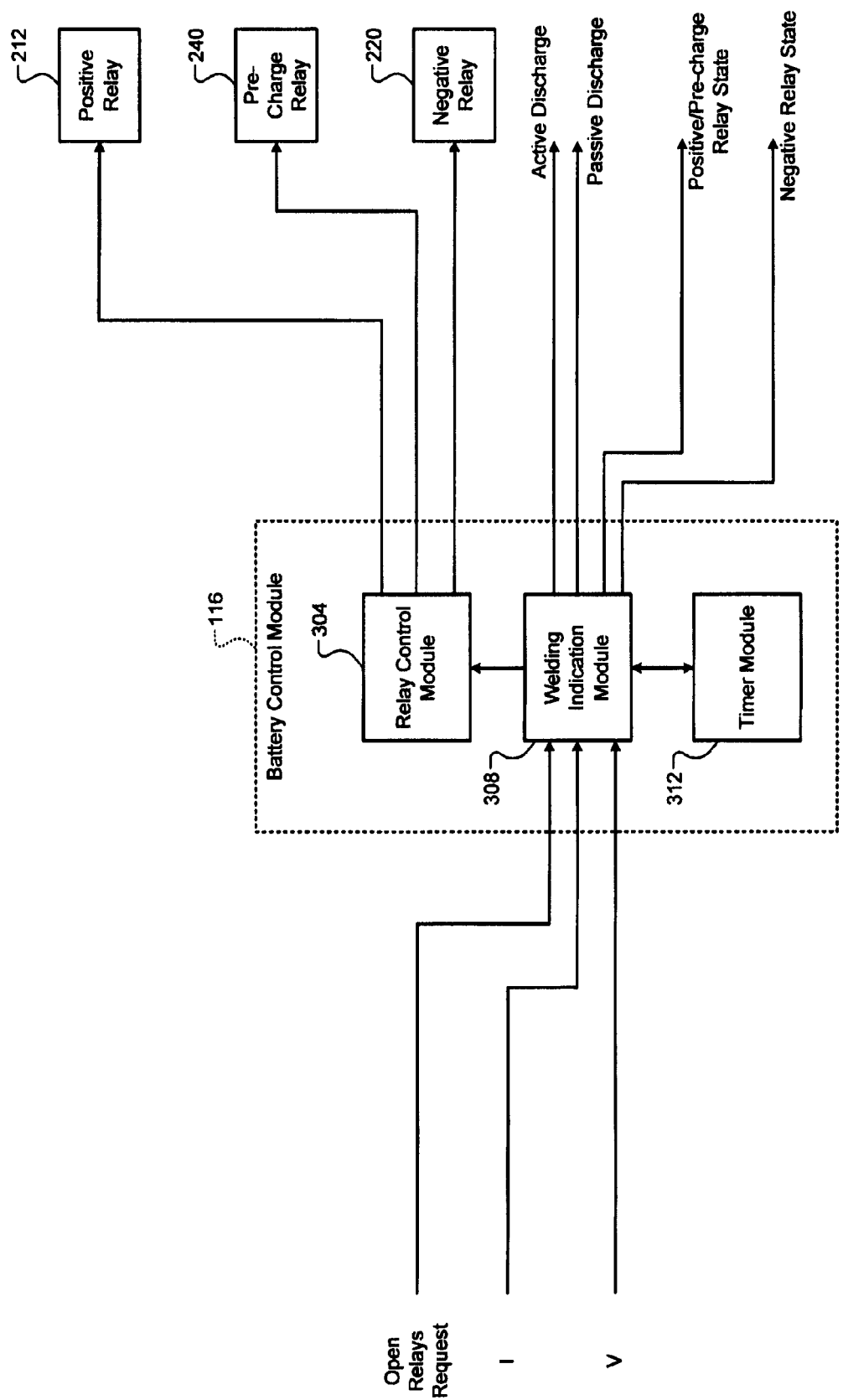
FIG. 3 is a functional block diagram of an example battery control module according to the present disclosure.
Figure 4:
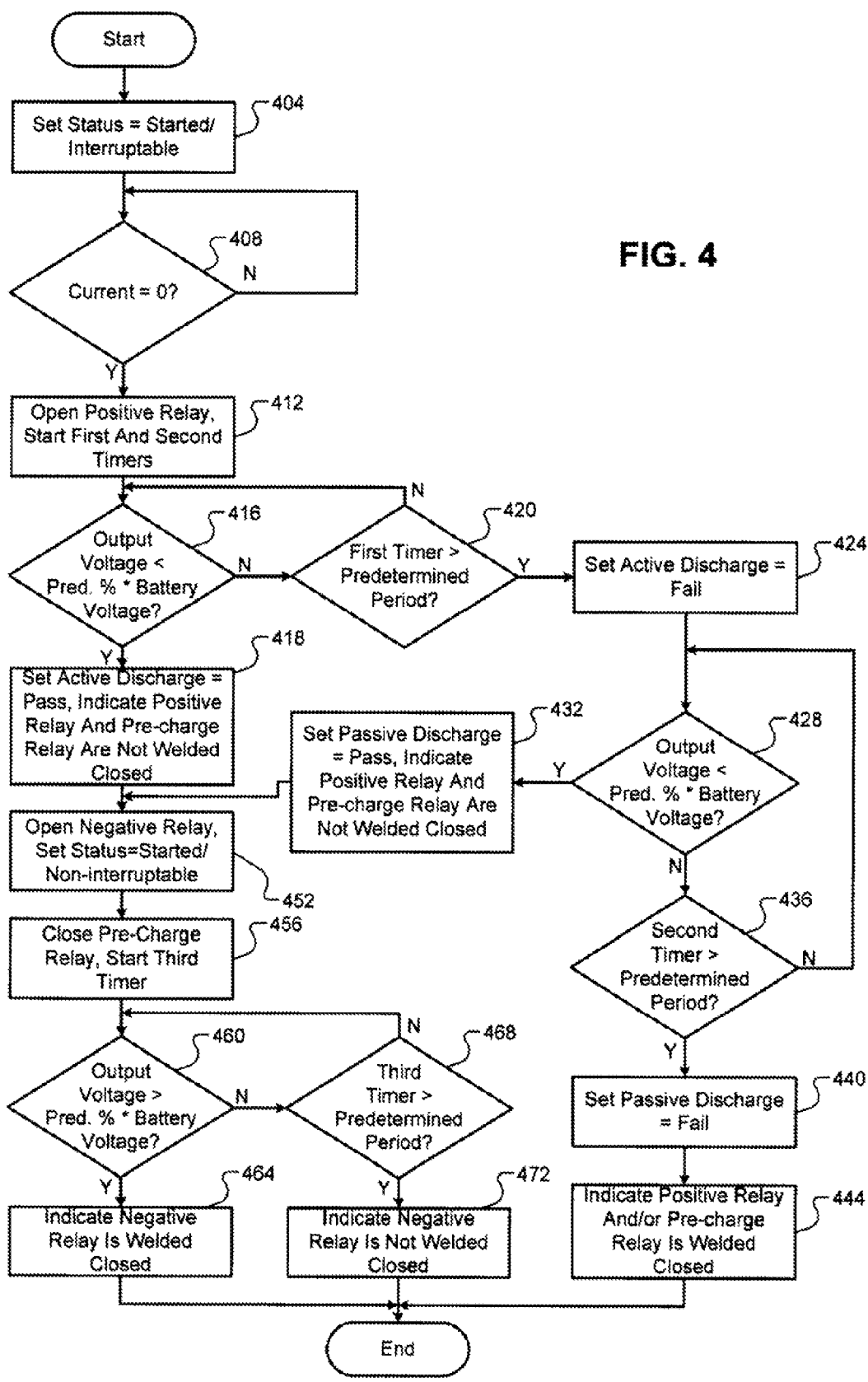
FIG. 4 is a flowchart depicting an example method of diagnosing welding of one or more relays of a battery pack according to the present disclosure.

FIG. 3 is a functional block diagram of an example implementation of the battery control module 116. FIG. 4 includes an example method including diagnosing whether the positive relay 212 and/or the negative relay 220 is welded closed. Referring now to FIGS. 3 and 4, control may begin when the battery control module 116 receives a request to open the positive relay 212, the pre-charge relay 240, and the negative relay 220. A request to open the positive relay 212, the pre-charge relay 240, and the negative relay 220 may be received, for example, during vehicle shutdown, in response to the occurrence of a fault in the vehicle 100, and/or under one or more other circumstances.

Figure 5:
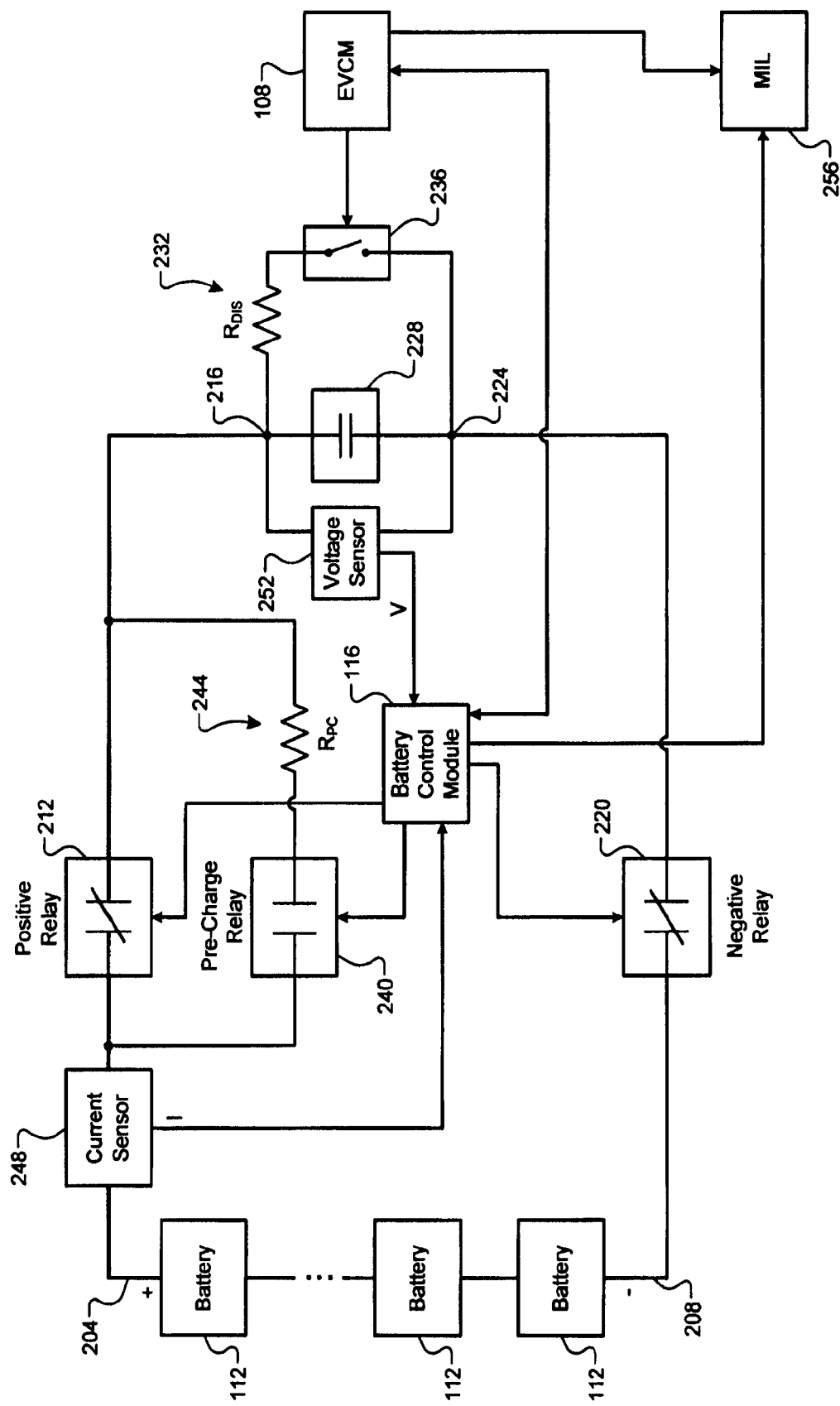
FIGS. 5-8 are functional block diagrams illustrating desired states of the relays of the battery pack at various times during the diagnosis according to the present disclosure.

At the time of the receipt of the request, the pre-charge relay 240 will generally be open, and the positive and negative relays 212 and 220 will generally be closed. FIG. 5 is a functional block diagram illustrating possible states of the positive relay 212, the pre-charge relay 240, and the negative relay 220 when a request is received to open the positive relay 212, the pre-charge relay 240, and the negative relay 220. A relay control module 304 may control the positive relay 212, the negative relay 220, and the pre-charge relay 240.

A welding indication module 308 controls the diagnosis of whether one or more of the relays is welded closed ("the welded contactor diagnosis"). At 404, the welding indication module 308 may set a status indicator to indicate that the welded contactor diagnosis has started but is still interruptible. The welded contactor diagnosis may be interrupted, for example, in response to the occurrence of a fault in the vehicle 100, when the vehicle 100 is started, and/or under one or more other circumstances. Control continues with 408.

At 408, the welding indication module 308 determines whether the current measured by the current sensor 248 is zero. If true, control continues with 412. If false, control may remain at 408. The welding indication module 308 may abort the welded contactor diagnosis and control may end when the current remains non-zero for a predetermined period.

Figure 6:
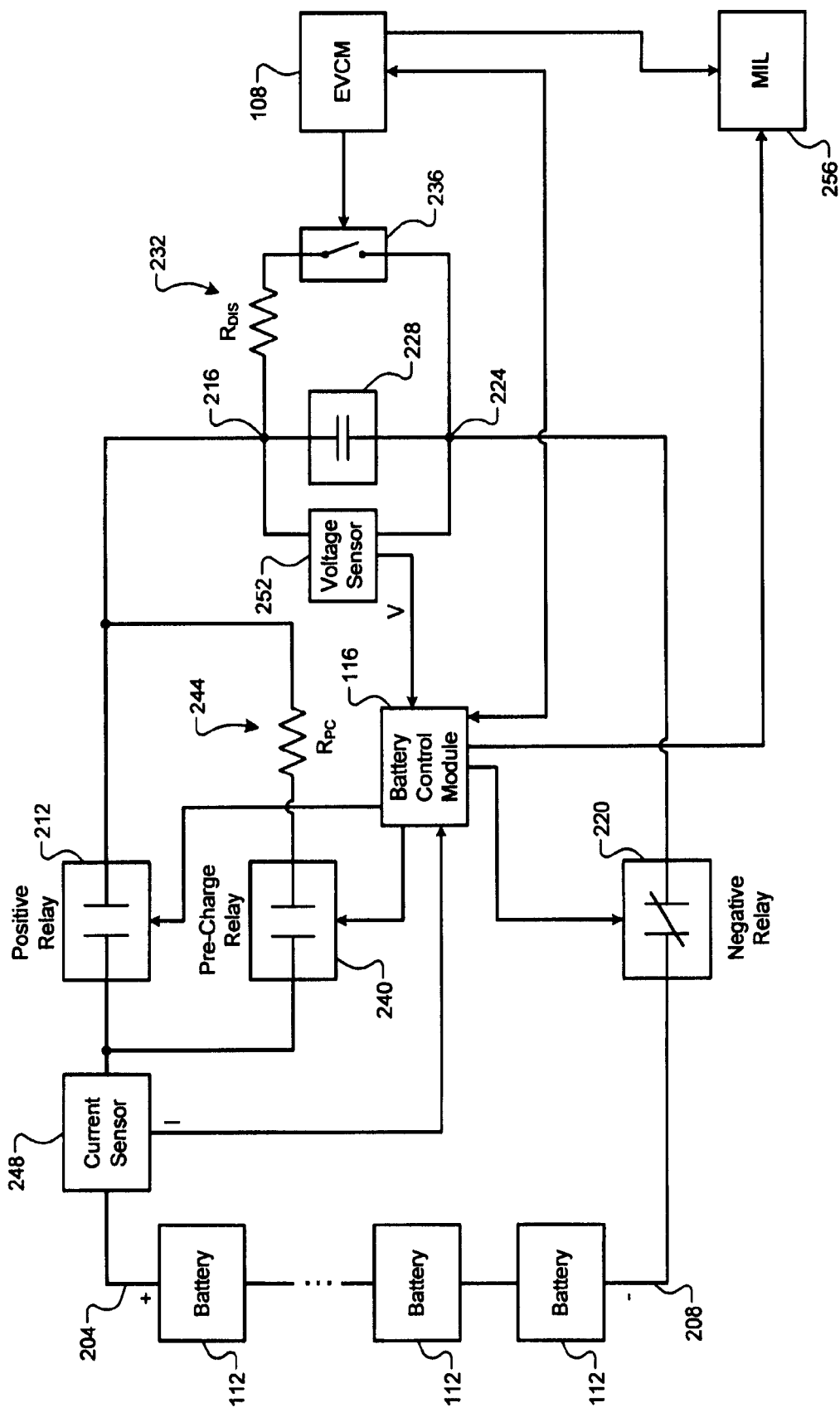

At 412, the welding indication module 308 commands the relay control module 304 to open the positive relay 212, and the relay control module 304 opens the positive relay 212. FIG. 6 is a functional block diagram illustrating the desired states of the positive relay 212, the pre-charge relay 240, and the negative relay 220 once the positive relay 212 is opened.

When the positive relay 212 is open, energy stored by the vehicle capacitance 228 may discharge. The energy discharge may be active discharge or passive discharge. Passive energy discharge may refer to the natural discharge of stored energy from the vehicle capacitance 228 that occurs over time. Active discharge may be performed, for example, by closing the discharge switch 236 such that energy is consumed by the discharge resistor 232, via the motor 144 (shown in FIG. 1), via the PIM 148 (shown in FIG. 1), and/or in one or more other suitable manners. The EVCM 108, the battery control module 116, the PIM 148, or another module that measures or receives the voltage between the third and fourth nodes 216 and 224 may control active discharge.

The welding indication module 308 also resets and starts first and second timers of a timer module 312 at 412. The first and second timers track the period elapsed since the positive relay 212 should have been opened. Control continues with 416.

The welding indication module 308 determines whether the output voltage has decreased to less than a first predetermined percentage of the battery voltage at 416. If true, the welding indication module 308 may set an active discharge signal to a first (pass) state at 418, and control may continue with 452, which is discussed further below. Control may also indicate that the positive and pre-charge relays 212 and 240 are not welded closed at 418. If false, control may transfer to 420.

At 420, the welding indication module 308 determines whether the first timer is greater than a first predetermined period. If false, control returns to 416. If true, the welding indication module 308 sets the active discharge signal to a second (fail) state at 424, and control continues with 428. In this manner, the active discharge signal indicates that active discharge of the vehicle capacitance 228 did not occur when the output voltage measured by the voltage sensor 252 did not decrease to less than the first predetermined percentage of the battery voltage within the first predetermined period, and vice versa.

The welding indication module 308 may communicate the active discharge signal to the EVCM 108 and/or one or more other modules of the vehicle 100. Based on the state of the EVCM 108 and whether the EVCM 108 attempted to actively discharge the vehicle capacitance 228, the EVCM 108 may determine whether an active discharge fault has occurred. For example, the EVCM 108 may determine that an active discharge fault occurred when the EVCM 108 attempted to actively discharge the vehicle capacitance 228 and the active discharge signal is in the second state, or vice versa.

At 428, the welding indication module 308 determines whether the output voltage has decreased to less than a second predetermined percentage of the battery voltage at 416. If true, control may continue with 432; if false, control may continue with 436. At 432, the welding indication module 308 may set a passive discharge signal to a first (pass) state at 432 and indicate that neither the positive relay 212 nor the pre-charge relay 240 is welded closed. Control then continues with 452, which is discussed further below. The welding indication module 308 may indicate that neither the positive relay 212 nor the pre-charge relay 240 is welded closed, for example, by setting a positive/pre-charge relay state signal to a first (pass) state.

At 436, the welding indication module 308 determines whether the second timer is greater than a second predetermined period. If false, control returns to 428. If true, the welding indication module 308 sets the passive discharge signal to a second (fail) state at 440, and control continues with 444. In this manner, the passive discharge signal indicates that passive discharge of the vehicle capacitance 228 did not occur when the output voltage measured by the voltage sensor 252 did not decrease to less than the second predetermined percentage of the battery voltage within the second predetermined period, and vice versa.

The fact that energy was not passively or actively discharged from the vehicle capacitance 228 while the positive relay 212 was supposed to be open indicates that the batteries 112 are still supplying power to the vehicle capacitance 228. As such, the welding indication module 308 indicates that the positive relay 212 and/or the pre-charge relay 240 is welded closed at 444, and control may end. The relay control module 304 may open the negative relay 220 before ending. The welding indication module 308 may indicate that the positive relay 212 and/or the pre-charge relay 240 is welded closed, for example, by setting the positive/pre-charge relay state signal to a second (fail) state.

Figure 7:
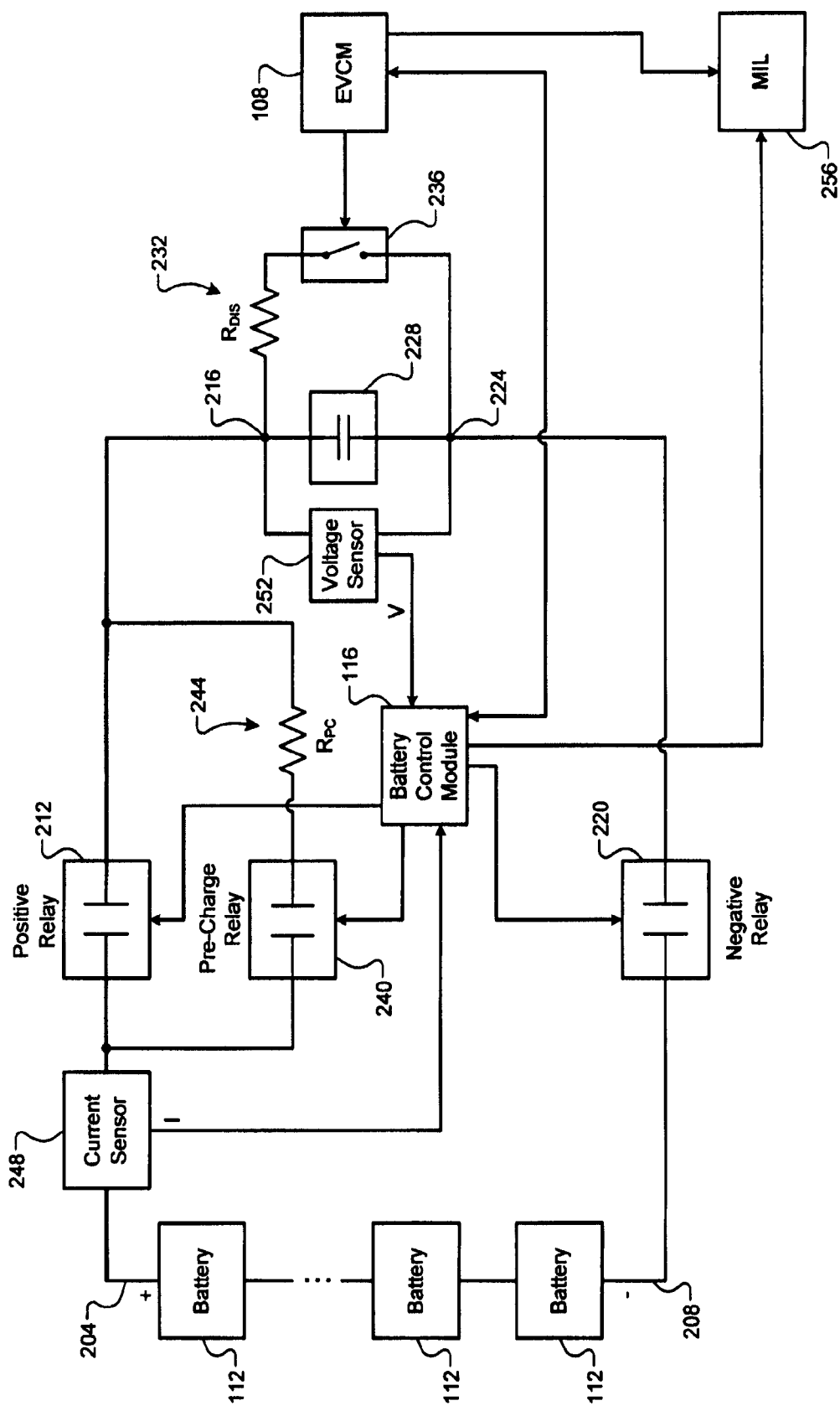

Referring back to 452, the welding indication module 308 commands the relay control module 304 to open the negative relay 220, and the relay control module 304 opens the negative relay 220 at 452. FIG. 7 is a functional block diagram illustrating the desired states of the positive relay 212, the pre-charge relay 240, and the negative relay 220 once the negative relay 220 is opened. The welding indication module 308 may also set the status indicator to indicate that the welded contactor diagnosis has started and is now non-interruptible. Control continues with 456.

Figure 8:
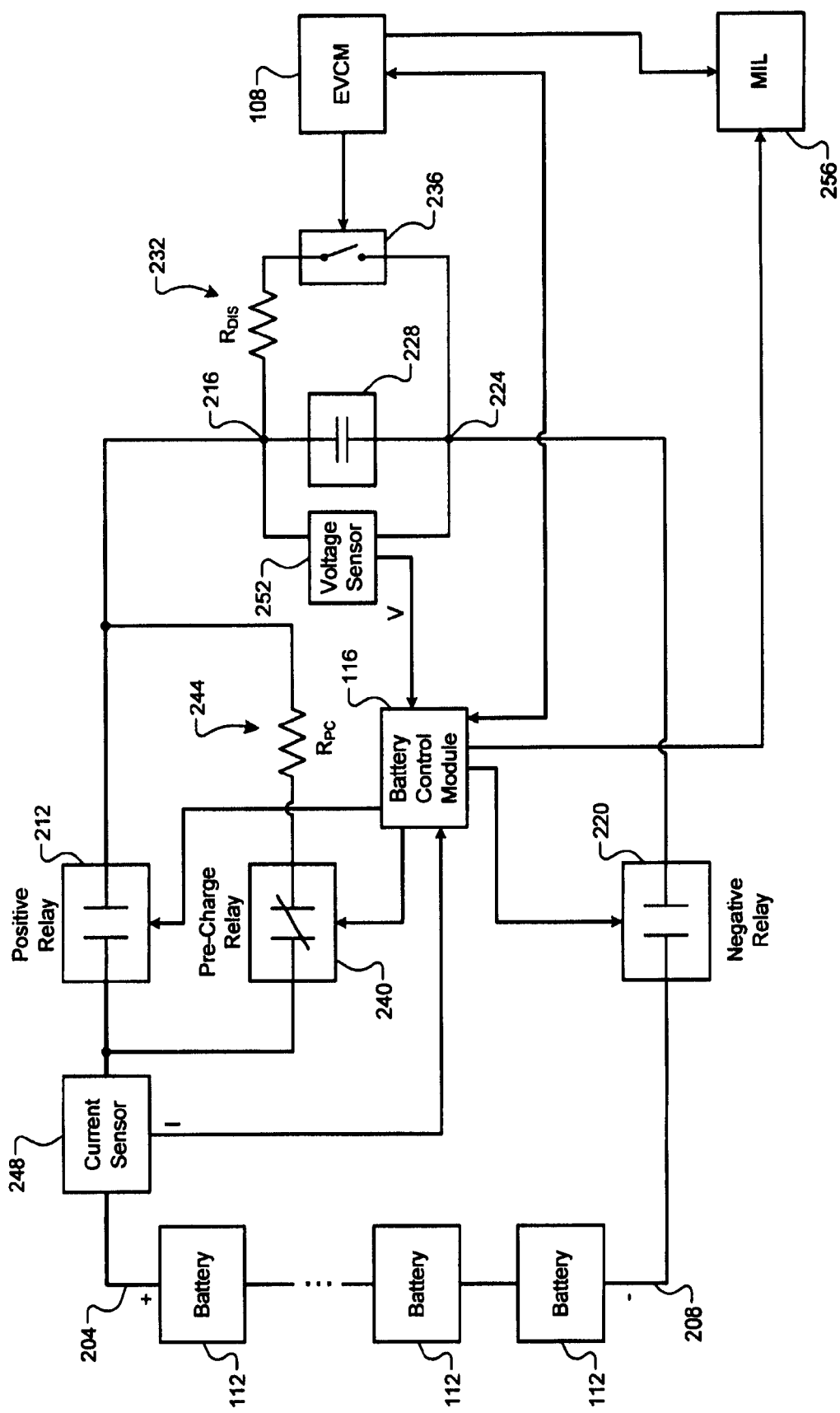

The welding indication module 308 commands the relay control module 304 to close the pre-charge relay 240, and the relay control module 304 closes the pre-charge relay 240 at 456. FIG. 8 is a functional block diagram illustrating the desired states of the positive relay 212, the pre-charge relay 240, and the negative relay 220 once the pre-charge relay 240 is closed. The closing of the pre-charge relay 240 would allow the batteries 112 to charge the vehicle capacitance 228 if the negative relay 220 is welded closed. The welding indication module 308 may also reset and start a third timer of the timer module 312 at 456. The third timer tracks the period elapsed since the pre-charge relay 240 was closed after the negative relay 220 should have been opened. Control continues with 460.

At 460, the welding indication module 308 determines whether the output voltage is greater than a third predetermined percentage of the battery voltage. Alternatively, the welding indication module 308 may determine whether the output voltage increases at 460. If false, control may continue with 468. If true, the welding indication module 308 may indicate that the negative relay 220 is welded closed at 464, and control may end. The relay control module 304 may open the pre-charge relay 240 before ending. The welding indication module 308 may indicate that the negative relay 220 is welded closed, for example, by setting a negative relay state signal to a second (fail) state.

At 468, the welding indication module 308 determines whether the third timer is greater than a third predetermined period. If false, control returns to 460. If true, the welding indication module 308 may indicate that the negative relay 220 is not welded closed at 472, and control may end. The welding indication module 308 may indicate that the negative relay 220 is not welded closed, for example, by setting the negative relay state signal to a first (pass) state.

One or more remedial actions may be taken when the positive relay 212, the negative relay 220, and/or the pre-charge relay 240 is welded closed. For example, a predetermined DTC may be set in memory, the MIL 256 may be illuminated, and/or one or more other suitable remedial actions may be taken when the positive relay 212, the negative relay 220, and/or the pre-charge relay 240 is welded closed.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings and the specification.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); a discrete circuit; an integrated circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be partially or fully implemented by one or more computer programs executed by one or more processors. The computer programs include processor-executable instructions that are stored on at least one non-transitory tangible computer readable medium. The computer programs may also include and/or rely on stored data. Non-limiting examples of the non-transitory tangible computer readable medium include nonvolatile memory, volatile memory, magnetic storage, and optical storage.

What is claimed is:
1. A system of a vehicle, comprising:
a plurality of batteries that are electrically connected and that collectively output power for an electric motor via first and second nodes;
a first relay that is connected between a first output of the batteries and the first node;
a second relay that is connected between a second output of the batteries and the second node;
a third relay that is connected between the first output of the batteries and the first node; and
a battery control module comprising:
a relay control module operatively connected to the first and second relays and configured to open and close the first and second relays; and
a welding indication module operatively connected to the relay control module and configured to (i) command the relay control module to open the first relay during a first diagnosis period, (ii) command the relay control module to close the second relay during the first diagnosis period, (iii) measure a first voltage difference between a voltage at the first node and a voltage at the second node during the first diagnosis period, the first voltage difference being measured while the first relay is commanded open by the relay control module and the second relay is commanded closed by the relay control module, and (iv) output whether the first relay is welded closed based on the measured first voltage difference during the first diagnosis period, wherein the welding indication module is further configured to (i) command the relay control module to open the first relay during a second diagnosis period, (ii) command the relay control module to close the third relay during the second diagnosis period, (iii) command the relay control module to open the second relay during the second diagnosis period, (iv) measure a second voltage difference between a voltage at the first node and a voltage at the second node during the second diagnosis period, the second voltage difference being measured while the first relay is commanded open by the relay control module, the second relay is commanded open by the relay control module, and the third relay is commanded closed by the relay control module, and (v) output whether the second relay is welded closed in response to the measured second voltage difference during the second diagnosis period.

2. The system of claim 1 wherein the welding indication module is configured to output whether the first relay is welded closed in response to a change in the first voltage difference during the first diagnosis period.

3. The system of claim 1 wherein the welding indication module configured to output whether the first relay is welded closed in response to a comparison of the first voltage difference and a third voltage difference measured between a voltage at the first output of the batteries and a voltage at the second output of the batteries during the first diagnosis period, the third voltage difference being measured while the first relay is commanded open by the relay control module and the second relay is commanded closed by the relay control module.

4. The system of claim 3 wherein the welding indication module is configured to:
selectively output that the first relay is welded closed when the first voltage difference remains greater than a predetermined percentage of the third voltage difference; and
output that the first relay is not welded closed when the first voltage difference is less than the predetermined percentage of the third voltage difference.

5. The system of claim 3 wherein the welding indication module is configured to:
output that the first relay is welded closed when the first voltage difference remains greater than first and second predetermined percentages of the third voltage difference during first and second predetermined periods, respectively; and
output that the first relay is not welded closed when at least one of:
the first voltage difference is less than the first predetermined percentage of the third voltage difference during the first predetermined period; and
the first voltage difference is less than the second predetermined percentage of the third voltage difference during the second predetermined period.

6. The system of claim 1 wherein the welding indication module is configured to output whether the second relay is welded closed in response to a comparison of the second voltage difference and a fourth voltage difference measured between a voltage at the first output of the batteries and a voltage at the second output of the batteries during the second diagnosis period, the fourth voltage difference being measured while the first relay is commanded open by the relay control module, the second relay is commanded open by the relay control module, and the third relay is commanded closed by the relay control module.

7. The system of claim 6 wherein the welding indication module is configured to:
output that the second relay is welded closed when the second voltage difference is greater than a second predetermined percentage of the fourth voltage difference; and
output that the second relay is not welded closed when the second voltage difference remains less than the second predetermined percentage of the fourth voltage difference.

8. The system of claim 1 wherein the welding indication module is configured to illuminate a malfunction indicator lamp (MIL) when at least one of the first relay and the second relay is welded closed.

9. A method comprising:
providing a plurality of batteries that are electrically connected and that collectively output power for an electric motor via first and second nodes;
providing a first relay that is connected between a first output of the batteries and the first node;
providing a second relay that is connected between a second output of the batteries and the second node;
providing a third relay that is connected between the first output of the batteries and the first node;
controlling the first relay and the second relay;
commanding opening of the first relay during a first diagnosis period;
commanding closing of the second relay during the first diagnosis period;
measuring a first voltage difference between a voltage at the first node and a voltage at the second node during the first diagnosis period, the first voltage difference being measured while the first relay is commanded open by the relay control module and the second relay is commanded closed by the relay control module;
outputting whether the first relay is welded closed based on the measured first voltage difference during the first diagnosis period;
commanding opening of the first relay during a second diagnosis period;
commanding closing of the third relay during the second diagnosis period;
commanding opening of the second relay during the second diagnosis period;
measure a second voltage difference between a voltage at the first node and a voltage at the second node during the second diagnosis period, the second voltage difference being measured while the first relay is commanded open by the relay control module, the second relay is commanded open by the relay control module, and the third relay is commanded closed by the relay control module; and
outputting whether the second relay is welded closed in response to the measured second voltage difference during the second diagnosis period.

10. The method of claim 9 further comprising outputting whether the first relay is welded closed in response to a change in the first voltage difference during the first diagnosis period.

11. The method of claim 9 further comprising outputting whether the first relay is welded closed in response to a comparison of the first voltage difference and a third voltage difference measured between a voltage at the first output of the batteries and a voltage at the second output of the batteries during the first diagnosis period, the third voltage difference being measured while the first relay is commanded open by the relay control module and the second relay is commanded closed by the relay control module.

12. The method of claim 11 further comprising:
   selectively outputting that the first relay is welded closed when the first voltage difference remains greater than a predetermined percentage of the third voltage difference; and
   outputting that the first relay is not welded closed when the first voltage difference is less than the predetermined percentage of the third voltage difference.

13. The method of claim 11 further comprising:
   outputting that the first relay is welded closed when the first voltage difference remains greater than first and second predetermined percentages of the third voltage difference during first and second predetermined periods, respectively; and
   outputting that the first relay is not welded closed when at least one of:
      the first voltage difference is less than the first predetermined percentage of the third voltage difference during the first predetermined period; and
      the first voltage difference is less than the second predetermined percentage of the third voltage difference during the second predetermined period.

14. The method of claim 9 further comprising outputting whether the second relay is welded closed in response to a comparison of the second voltage difference and a fourth voltage difference measured between a voltage at the first output of the batteries and a voltage at the second output of the batteries during the second diagnosis period, the fourth voltage difference being measured while the first relay is commanded open by the relay control module, the second relay is commanded open by the relay control module, and the third relay is commanded closed by the relay control module.

15. The method of claim 14 further comprising:
   outputting that the second relay is welded closed when the second voltage difference is greater than a second predetermined percentage of the fourth voltage difference; and
   outputting that the second relay is not welded closed when the second voltage difference remains less than the second predetermined percentage of the fourth voltage difference.

16. A system comprising:
   a plurality of batteries that are electrically connected and that collectively output power for a load via first and second nodes;
   a first relay that is connected between a first output of the batteries and the first node;
   a second relay that is connected between a second output of the batteries and the second node;
   a third relay that is connected between the first output of the batteries and the first node; and
   a battery control module comprising:
      a relay control module operatively connected to the first and second relays and configured to open and close the first and second relays; and
      a welding indication module operatively connected to the relay control module and configured to (i) command the relay control module to open the first relay during a diagnosis period, (ii) command the relay control module to close the second relay during the diagnosis period, (iii) measure a first voltage difference between a voltage at the first node and a voltage at the second node during the diagnosis period, the first voltage difference being measured while the first relay is commanded open by the relay control module and the second relay is commanded closed by the relay control module, and (iv) output whether the first relay is welded closed based on the measured first voltage difference during the diagnosis period,
   wherein the welding indication module is further configured to (i) command the relay control module to open the first relay during a second diagnosis period, (ii) command the relay control module to close the third relay during the second diagnosis period, (iii) command the relay control module to open the second relay during the second diagnosis period, (iv) measure a second voltage difference between a voltage at the first node and a voltage at the second node during the second diagnosis period, the second voltage difference being measured while the first relay is commanded open by the relay control module, the second relay is commanded open by the relay control module, and the third relay is commanded closed by the relay control module, and (v) output whether the second relay is welded closed in response to the measured second voltage difference during the second diagnosis period.

* * * * *